United States Patent [19]

Chi et al.

[11] Patent Number: 5,753,954
[45] Date of Patent: May 19, 1998

[54] SINGLE-POLY NEURON MOS TRANSISTOR

[75] Inventors: Min-hwa Chi; Albert Bergemont, both of Palo Alto, Calif.

[73] Assignee: National Semiconductor Corporation, Santa Clara, Calif.

[21] Appl. No.: 684,410

[22] Filed: Jul. 19, 1996

[51] Int. Cl.[6] .................................................. H01L 29/788
[52] U.S. Cl. ........................ 257/318; 257/314; 257/316; 257/365; 257/270; 438/264
[58] Field of Search .............................. 257/314, 315, 257/316, 318, 365, 366, 270; 438/257–267

[56] References Cited

U.S. PATENT DOCUMENTS

| | | | |
|---|---|---|---|
| 3,906,296 | 9/1975 | Maserjian et al. | 257/321 |
| 4,404,577 | 9/1983 | Cranford, Jr. et al. | 257/318 |
| 4,642,673 | 2/1987 | Miyamoto et al. | 257/316 |
| 4,649,520 | 3/1987 | Eitan | 257/318 |
| 4,807,003 | 2/1989 | Mohammadi et al. | 257/318 |
| 4,935,790 | 6/1990 | Cappelletti et al. | 257/318 |
| 5,504,706 | 4/1996 | D'Arrigo et al. | 365/185.18 |
| 5,554,545 | 9/1996 | Wu et al. | 437/40 |
| 5,583,360 | 12/1996 | Roth et al. | 257/316 |
| 5,594,372 | 1/1997 | Shibata et al. | 326/121 |
| 5,608,340 | 3/1997 | Shibata et al. | 326/36 |
| 5,650,346 | 7/1997 | Pan et al. | 257/316 |
| 5,656,838 | 8/1997 | Shinmori | 257/315 |
| 5,666,467 | 9/1997 | Colak | 395/24 |

OTHER PUBLICATIONS

Shibata, T. et al., "Neuron MOS Binary–Logic Integrated Circuits—Part I: Design Fundamentals and Soft–Hardware–Logic Circuit Implementation," IEEE Trans. on Electron Devices, vol. 40, No. 3, pp. 570–575 (Mar. 1993).

Shibata, T. et al., "Neuron MOS Binary–Logic Integrated Circuits—Part II: Simplifying Techniques of Circuit Configuration and their Practical Applications," IEEE Trans. on Electron Devices, vol. 40, No. 5, pp. 974–979 (May 1993).

Shibata, T. et al., "A Functional MOS Transistor Featuring Gate–Level Weighted Sum and Threshold Operations," IEEE Trans. on Electron Devices, vol. 39, No. 6, pp. 1444–1455 (Jun. 1992).

*Primary Examiner*—Tom Thomas
*Assistant Examiner*—David B. Hardy
*Attorney, Agent, or Firm*—Limbach & Limbach L.L.P.

[57] ABSTRACT

A single-poly neuron transistor is formed by utilizing a series of doped substrate regions in lieu of the input gates that are conventionally used to form neuron transistors. With conventional neuron transistors, the input gates are isolated from the floating gate by a layer of interpoly dielectric. In the present invention, the series of doped substrate regions are isolated from the floating gate by a layer of gate oxide.

12 Claims, 4 Drawing Sheets

SINGLE-POLY NEURON MOS TRANSISTOR

BACKGROUND OF THE INVENTION

1. Field of the Invention

The present invention relates to neuron MOS transistors and, more particularly, to a single-poly neuron MOS transistor.

2. Description of the Related Art

Neuron MOS (vMOS) transistors are a type of floating-gate transistor that utilizes a plurality of control or input gates to control the on and off state of the transistor. By utilizing a plurality of input gates, a vMOS transistor can be made to operate much like a biological neuron.

FIG. 1 shows a plan view of a conventional vMOS transistor 10. FIGS. 2 and 3 show cross-sectional views taken along lines 2—2 and 3—3, respectively, of FIG. 1. As shown in FIGS. 1-3, vMOS transistor 10 includes source and drain regions 14 and 16 which are formed in a lightly-doped substrate 12, an adjacent field oxide region FOX, and a layer of gate oxide 22 which is formed over a channel region 18 defined between the source and drain regions 14 and 16.

In addition, transistor 10 also includes a floating gate 24 which is formed over the layer of gate oxide 22 and a portion of the adjacent field oxide region FOX, a layer of interpoly dielectric 26 which is formed over floating gate 24, and a series of spaced-apart input gates IG1-IGn which are formed over the layer of interpoly dielectric 26.

In operation, the voltages applied to the input gates IG1-IGn are capacitively coupled to floating gate 24 which, in turn, turns on transistor 10 when the potential on floating gate 24 is sufficient to form a conducting channel underneath the layer of gate oxide 22 (and appropriate voltages are applied to the source and drain regions 14 and 16).

Thus, to turn on transistor 10, the potential on floating gate 24 must be greater than a turn-on potential, i.e., the threshold voltage of transistor 10 as viewed from floating gate 24. The potential on floating gate 24, in turn, is defined by the equation:

$$V_{FG}=(C_{IG1}V_{IG1}+C_{IG2}V_{IG2}+C_{IGn}V_{IGn})/C_{TOT} \quad (1)$$

where $V_{FG}$ represents the floating gate potential, $C_{IG1}$-$C_{IGn}$ represent the capacitance associated with the input gates IG1-IGn with respect to floating gates 24, $V_{IG1}$-$V_{IGn}$ represent the voltages applied to the input gates IG1-IGn, and $C_{TOT}$ represents the total capacitance viewed from floating gate 24 which includes the capacitance between floating gate 24 and substrate 12.

Thus, as shown in equation (1), the potential on floating gate 24 is defined by the linear sum of all the voltages applied to the input gates IG1-IGn as weighted by the corresponding ratios of $C_{IG}/C_{TOT}$, which are commonly known as the capacitive coupling coefficients. The weight of the capacitive coupling coefficients, in turn, is determined by the relative area consumed by each of the input gates IG1-IGn.

As a result, floating gate 24 calculates the weighted sum of each of the input voltages, and then turns on transistor 10 when the weighted sum exceeds the turn-on potential of floating gate 24. By responding to a weighted sum in this manner, vMOS transistor 10 resembles a biological neuron that "fires" in response to different multiple-input conditions.

One drawback with vMOS transistor 10, however, is that two layers of polysilicon (poly) are required to form transistor 10, i.e., a poly-1 layer for floating gate 24, and a poly-2 layer for input gates IG1-IGn. The drawback with using two layers of poly, in turn, is that double-poly devices are more expensive and complicated to fabricate than single-poly devices. Thus, there is a need for a vMOS transistor that can be formed with a single layer of poly.

SUMMARY OF THE INVENTION

Conventionally, vMOS transistors utilize a series of input gates formed from a second layer of polysilicon (poly) to control the voltage on the floating gate. In the present invention, the second layer of poly is eliminated by utilizing a series of doped substrate regions in lieu of the input gates. As a result, vMOS transistors can now be formed by using a modified single-poly fabrication process rather than the more complex double-poly process that must be used to form conventional vMOS transistors.

In the present invention, a neuron transistor, which is formed in a substrate of a first conductivity type, includes source and drain regions of a second conductivity type that are formed in the substrate, and a channel region defined between the source and drain regions. In addition, the neuron transistor further includes a plurality of doped regions of the second conductivity type that are formed in the substrate, and an input region which is defined to enclose a portion of the plurality of doped regions. Further, the neuron transistor of the present invention also includes a layer of first insulation material formed over the channel and input regions, a first isolation region formed to isolate the source region, the drain region, and the channel region from the plurality of doped regions, and a layer of first polysilicon formed over the channel region, a portion of the first isolation region, and the input region.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
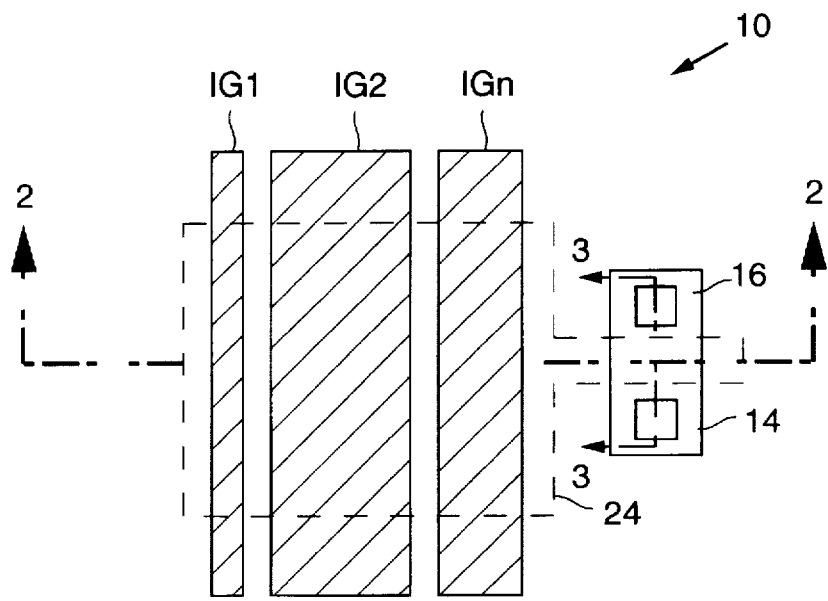
FIG. 1 is a plan view illustrating a conventional vMOS transistor 10.
Figure 2:
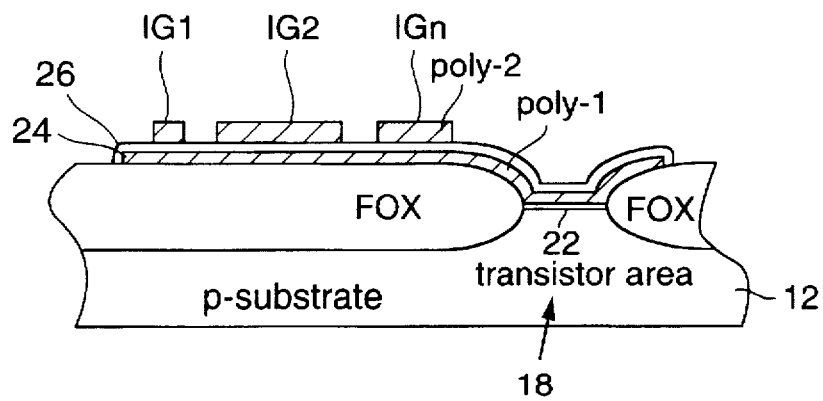
FIGS. 2–3 are cross-sectional views taken along lines 2—2 and 3—3, respectively, of FIG. 1.
Figure 3:
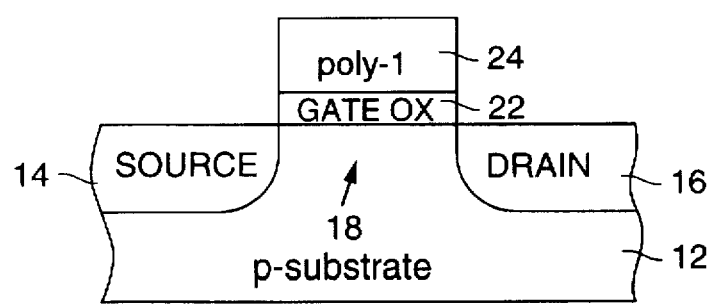
Figure 4:
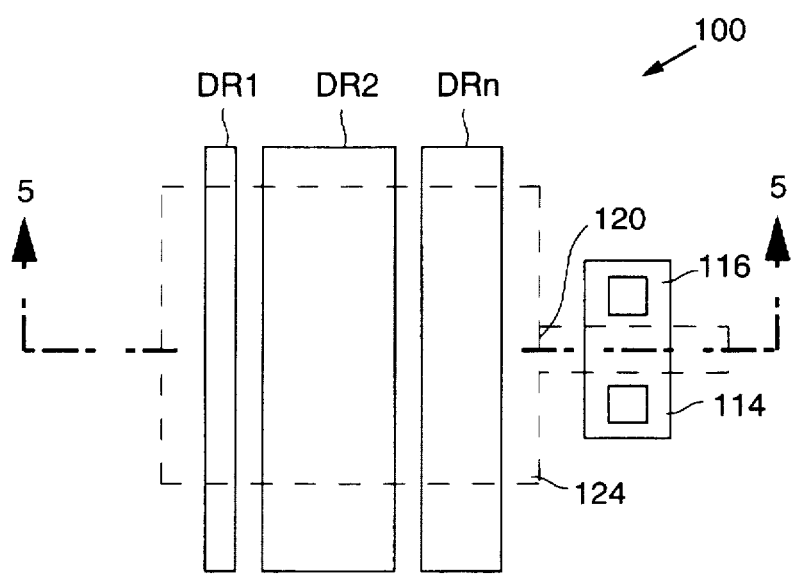
FIG. 4 is a plan view illustrating a vMOS transistor 100 in accordance with the present invention.
Figure 5:
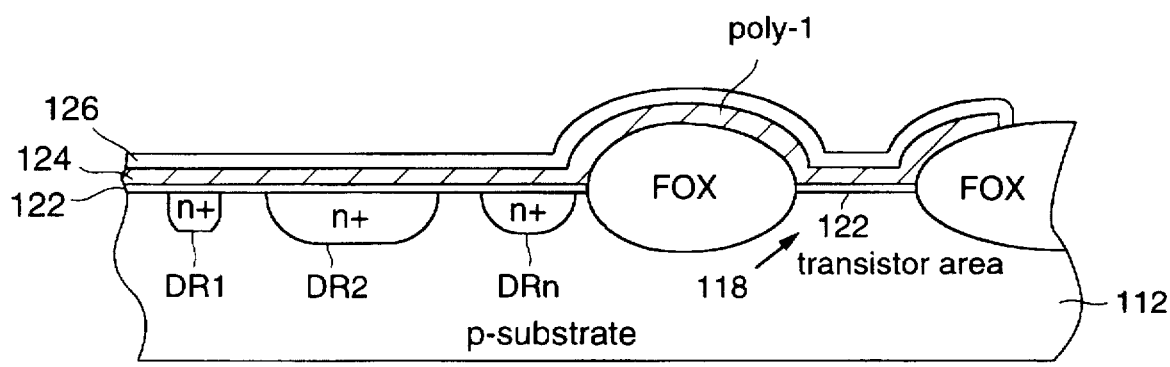
FIG. 5 is a cross-sectional view taken along line 5—5 of FIG. 4.

FIG. 4 shows a plan view of a neuron MOS (vMOS) transistor 100 formed in accordance with the present invention. FIG. 5 shows a cross-sectional view taken along lines 5—5 of FIG. 4. As described in greater detail below, vMOS transistor 100 eliminates the need for input gates, and thereby the need for a second layer of polysilicon, by utilizing doped substrate regions in lieu of the input gates.

As shown in FIGS. 4–5, vMOS transistor 100 includes n+ source and drain regions 114 and 116, and a series of n+ doped regions DR1-DRn which are formed in a lightly-doped p-type substrate 112. In addition, vMOS transistor 100 further includes a channel region 118 which is defined between source and drain regions 114 and 116, and an input region 120 which is defined to enclose a portion of the doped regions DR1-DRn.

As further shown in FIGS. 4–5, transistor 100 also includes a first isolation region, such as a field oxide region FOX, that separates source region 114, drain region 116, and channel region 118 from the doped regions DR1-DRn, a layer of first insulation material, such as gate oxide 122, which is formed over the channel and input regions 118 and 120, and a first layer of polysilicon 124 which is formed over the layer of gate oxide 122 and the field oxide region FOX. The first layer of polysilicon 124, which forms a floating gate, is enclosed by a layer of dielectric material 126.

In operation, the voltages applied to the doped regions DR1-DRn are capacitively coupled to floating gate 124 which, in turn, turns on transistor 100 when the potential on floating gate 124 is sufficient to form a conducting channel between the source and drain regions 114 and 116 (and appropriate voltages are applied to the source and drain regions 114 and 116).

The potential on floating gate 124 is still defined by equation (1) except that the coupling capacitance $C_{IG1}$-$C_{IGn}$ now represent the capacitance between the doped regions DR1-DRn with respect to floating gate 124. Thus, as above, transistor 100 will turn on when the sum of the voltages on floating gate 124 exceeds a turn-on voltage.

Figure 6:
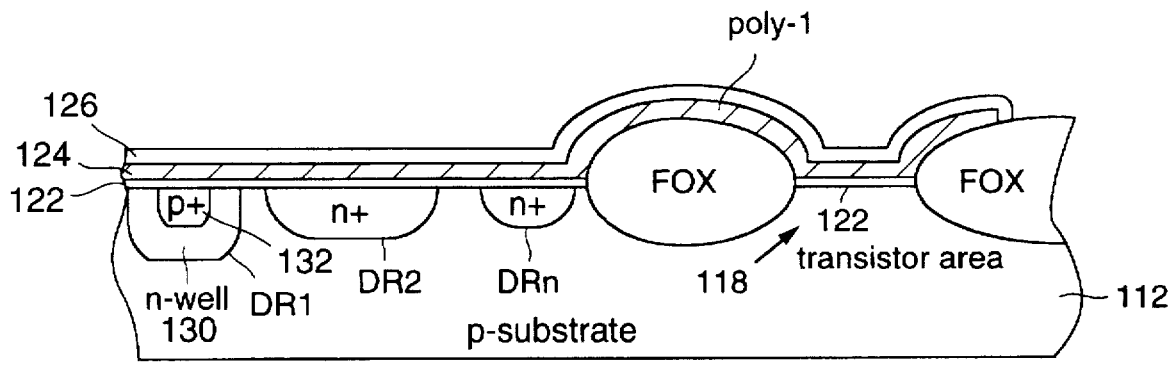
FIG. 6 is a cross-sectional view illustrating a first alternative embodiment of the present invention.

In a first alternative embodiment, as shown in FIG. 6, negative voltages can also be coupled to floating gate 124 by utilizing a p+ region 132 formed in an n-well 130 as a doped region DR. (N-well 130 can also be used as a doped region). Negative voltages can not be applied to doped regions DR1-DRn because the negative voltages will forward-bias the doped region-substrate junctions when substrate 112 is grounded. Substrate 112 is preferably grounded to prevent a voltage on the substrate from being coupled to floating gate 124.

Figure 7:
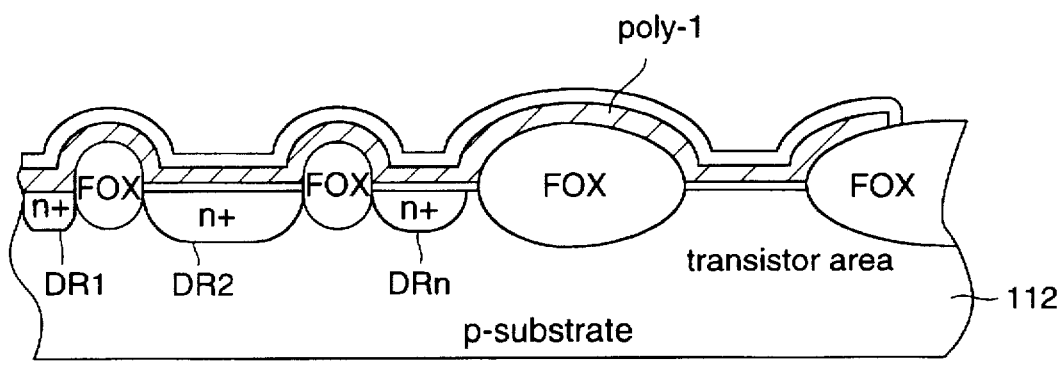
FIG. 7 is a cross-sectional view illustrating a second alternative embodiment of the present invention.

In a second alternative embodiment, rather than utilizing physical separation to provide isolation between the adjacent doped regions DR1-DRn, as shown in FIG. 5, other well known isolation techniques may also be used. For example, as shown in FIG. 7, LOCOS-formed field oxide regions FOX can be utilized to isolate the doped regions DR1-DRn.

Thus, a vMOS transistor has been described that eliminates the need for a second layer of poly by utilizing a series of doped substrate regions rather than a series of input lines to control the voltage on the floating gate.

The principle advantage of forming a vMOS transistor with a single layer of poly is that the transistor can be formed with only minor variations to a conventional single-poly CMOS process flow. For example, transistor 100, as shown in FIGS. 5 and 7, can be formed by modifying a conventional single-poly CMOS process flow (prior to the formation of floating gate 124) to include steps for masking and doping the doped regions DR1-DRn.

In addition, the modified single-poly flow also preferably includes a step for growing a layer of gate oxide approximately 130 Å thick over channel region 118. By utilizing a relatively thick layer of gate oxide over channel region 118, floating gate 124 will be less susceptible to charge injection. In addition, low-doped drain (LDD) structures are also preferably used with transistor 100 to lessen the likelihood of charge injection.

The layer of gate oxide 122 formed over input region 120, in turn, can be formed at the same time that the layer of gate oxide 122 is formed over channel region 118 or, alternately, can be formed at the same time that a layer of gate oxide is formed over the channel regions of any CMOS logic circuits.

One advantage to forming the layer of gate oxide 122 over input region 120 at the same time that the gate oxide is formed for the logic circuits is that a thinner layer of gate oxide (approximately 80 Å) can be formed over input region 120. A thinner layer of gate oxide, in turn, increases the capacitive coupling of the voltages applied to the doped regions DR1-DRn. (This also provides more coupling than can be obtained with conventional vMOS transistors which use a layer of interpoly dielectric that is approximately 140 Å thick).

Another advantage to using a thicker layer of gate oxide over channel region 118 is that transistor 100 can be operated with higher power supply voltages, e.g., five volts, which provide a larger output voltage swing. Alternately, the thickness of the layer of gate oxide, along with the power supply voltage, can be selected to be compatible with standard CMOS logic circuits.

Figure 8:
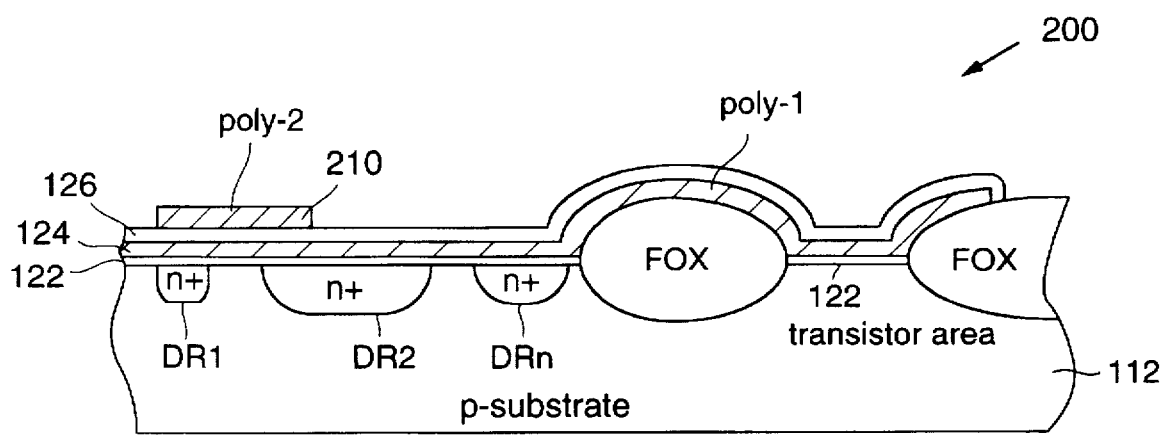
FIG. 8 is a cross-sectional view illustrating a double-poly vMOS transistor 200 in accordance with the present invention.

The concepts of the present invention can also be extended to a double-poly structure. FIG. 8 shows a cross-sectional view that illustrates a double-poly vMOS transistor 200 in accordance with the present invention. As shown in FIG. 8, transistor 200 is identical to transistor 100 except that transistor 200 also has a poly-2 input gate 210 formed on the layer of dielectric material 126 over the input region 120.

The advantage of utilizing both input gate 210 and the doped substrate regions DR1-DRn is that transistor 200 provides for additional inputs without increasing the size of transistor 200 over the size of transistor 100. In addition, poly-2 input gate 210 can couple both positive and negative voltages.

With respect to the fabrication process, poly-2 input gate 210 can be formed during the same masking and etching steps that are used in a conventional double-poly CMOS process to form other poly-2 structures. Similarly, poly-1 floating gate 124 can be formed during the same masking and etching steps that are used to form other poly-1 structures.

Figure 9:
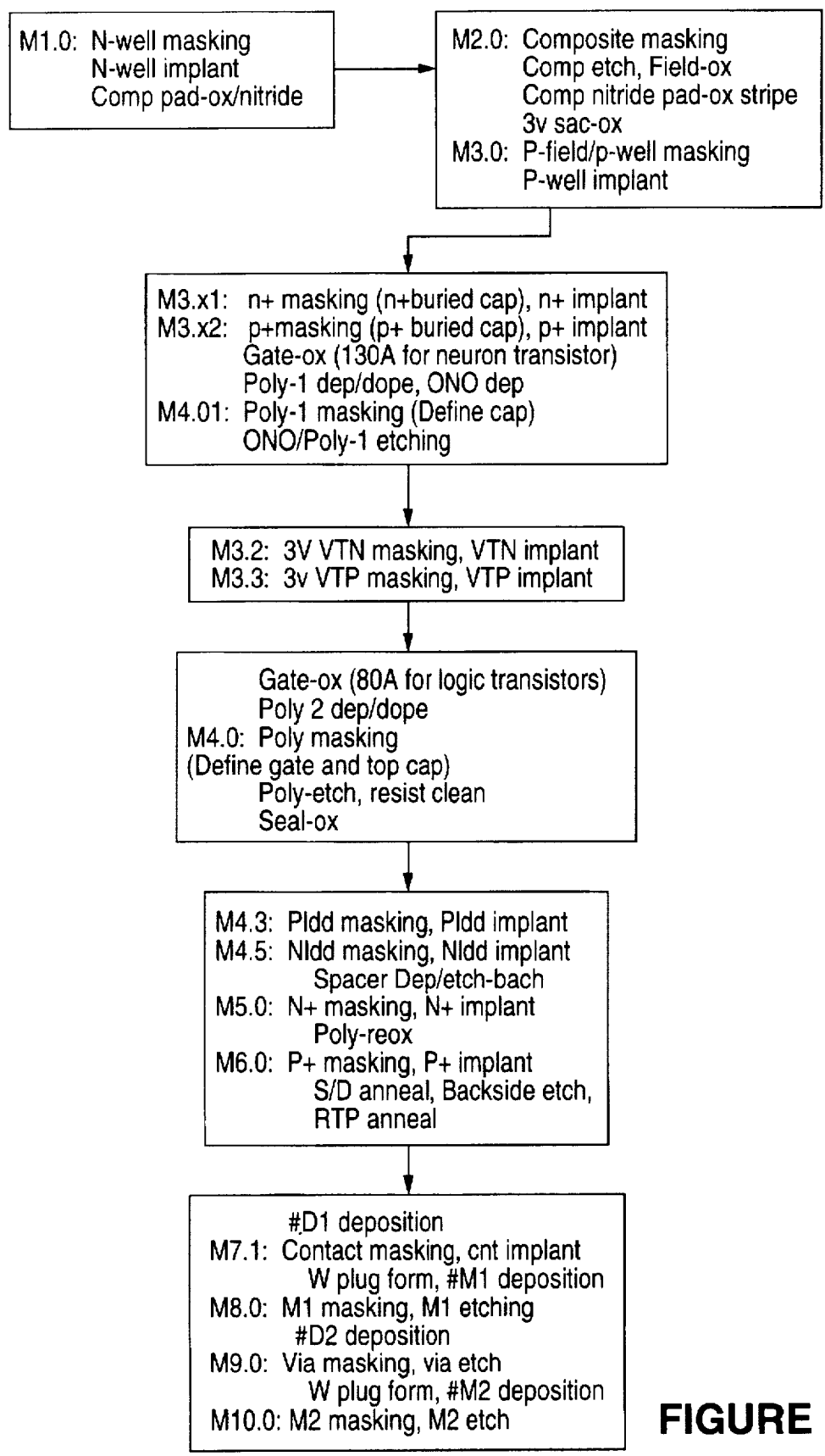
FIG. 9 is a modified double-poly CMOS process flow for forming transistor 200 along with conventional CMOS logic circuits.

As a result, a conventional double-poly CMOS process need only be modified to add the masking and etching steps required to form the doped regions DR1-DRn (along with a step for forming a thicker layer of gate oxide over channel region 118 if a thicker layer is desired). FIG. 9 shows a conventional double-poly CMOS process flow that has been modified to form transistor 200 along with conventional CMOS logic circuits (see steps M3.x1 and M3.x2).

It should be understood that various alternatives to the embodiment of the invention described herein may be employed in practicing the invention. For example, although the operation of the present invention has been described with respect to n+ regions formed in a p-type substrate, p+ regions formed in an n-type substrate may alternately be used.

Thus, it is intended that the following claims define the scope of the invention and that methods and structures within the scope of these claims and their equivalents be covered thereby.

What is claimed is:

1. A neuron transistor formed in a substrate of a first conductivity type, the transistor comprising:
   a source region of a second conductivity type formed in the substrate;
   a drain region of the second conductivity type formed in the substrate;
   a channel region defined between the source and drain regions;
   a plurality of doped regions of the second conductivity type formed in the substrate;
   an input region defined to enclose a portion of the plurality of doped regions;
   a layer of first insulation material formed over the channel region and the input region, the layer of first insulation material formed over the channel region being thicker than the layer of first insulation material formed over the input region;
   a first isolation region formed to isolate the source region, the drain region, and the channel region from the plurality of doped regions; and
   a layer of first polysilicon formed over the channel region, a portion of the first isolation region, and the input region.

2. The transistor of claim 1 wherein the layer of first insulation material includes gate oxide.

3. The transistor of claim 1 wherein the first isolation region includes LOCOS-formed field oxide regions.

4. The transistor of claim 1 wherein the layer of first polysilicon forms a floating gate.

5. The transistor of claim 1 and further comprising a plurality of second isolation regions formed to isolate adjacent doped regions.

6. The transistor of claim 5 wherein the second isolation regions include LOCOS-formed field oxide regions.

7. The transistor of claim 1 and further including:
   a layer of second insulation material formed on the layer of first polysilicon; and
   a layer of second polysilicon formed on the layer of second insulation material over the input region.

8. The transistor of claim 7 wherein the layer of second insulation material includes an interpoly dielectric.

9. The transistor of claim 1 wherein the plurality of doped regions includes:
   a well region of the second conductivity type; and
   an opposite voltage region of the first conductivity type formed in the well region.

10. A neuron transistor formed in a substrate of a first conductivity type, the transistor comprising:
    a source region of a second conductivity type formed in the substrate;
    a drain region of the second conductivity type formed in the substrate;
    a channel region defined between the source and drain regions;
    a plurality of doped regions of the second conductivity type formed in the substrate, the plurality of doped regions including:
    a well region of the second conductivity type; and
    an opposite voltage region of the first conductivity type formed in the well region;
    an input region defined to enclose a portion of the plurality of doped regions;
    a layer of first insulation material formed over the channel region and the input region;
    a first isolation region formed to isolate the source region, the drain region, and the channel region from the plurality of doped regions; and
    a layer of first polysilicon formed over the channel region, a portion of the first isolation region, and the input region.

11. The transistor of claim 10 and further including:
    a layer of second insulation material formed on the layer of first polysilicon; and
    a layer of second polysilicon formed on the layer of second insulation material over the input region.

12. The transistor of claim 11 wherein the layer of second polysilicon forms an input gate.

* * * * *